(12) United States Patent
Auge et al.

(10) Patent No.: US 7,206,980 B2
(45) Date of Patent: Apr. 17, 2007

(54) INTEGRATED SEMICONDUCTOR MEMORY

(75) Inventors: Jürgen Auge, Unterhaching (DE);
Manfred Pröll, Dorfen (DE); Jörg Kliewer, München (DE); Frank Schroeppel, Taufkirchen (DE)

(73) Assignee: Infineon Technologies AG, Munich (DE)

(*) Notice: Subject to any disclaimer, the term of this patent is extended or adjusted under 35 U.S.C. 154(b) by 146 days.

(21) Appl. No.: 11/123,221

(22) Filed: May 6, 2005

(65) Prior Publication Data
US 2005/0249002 A1 Nov. 10, 2005

(30) Foreign Application Priority Data
May 6, 2004 (DE) .................... 10 2004 022 327

(51) Int. Cl.
*G11C 29/00* (2006.01)
*G06F 11/00* (2006.01)

(52) U.S. Cl. ..................... 714/718; 714/704

(58) Field of Classification Search ............... None
See application file for complete search history.

(56) References Cited

U.S. PATENT DOCUMENTS

| | | | |
|---|---|---|---|
| 5,640,354 A * | 6/1997 | Jang et al. | 365/201 |
| 6,295,237 B1 | 9/2001 | Pochmuller | |
| 6,539,506 B1 * | 3/2003 | Lammers et al. | 714/719 |
| 6,684,353 B1 | 1/2004 | Parker et al. | |
| 6,829,181 B1 * | 12/2004 | Seitoh | 365/201 |

* cited by examiner

*Primary Examiner*—Christine T. Tu
(74) *Attorney, Agent, or Firm*—Edell, Shapiro & Finnan, LLC (57) ABSTRACT

An integrated semiconductor memory includes a memory cell array with at least one memory cell, in which a data value is stored, and an evaluation circuit with a counter. During a test of the integrated semiconductor memory, a counter reading of the counter is altered if the data value stored in the memory cell deviates from a desired value. A threshold value is predefined by a control circuit. A programming circuit compares the threshold value on the input side with the instantaneous counter reading of the counter. If the counter reading of the counter exceeds the threshold value, a programming element changes from a first programming state to a second programming state. After the conclusion of the test, the state of the programming element is read out via an output terminal. This scheme makes it possible to deduce a possible cause of failure of the integrated semiconductor memory.

23 Claims, 3 Drawing Sheets

INTEGRATED SEMICONDUCTOR MEMORY

CROSS REFERENCE TO RELATED APPLICATIONS

This Application Claims Priority Under 35 U.S.C. §119 to German Application No. DE 102004022327.0, filed on May 6, 2004, entitled "Integrated Semiconductor Memory" the entire contents of which are hereby incorporated by reference.

FIELD OF THE INVENTION

The invention relates to an integrated semiconductor memory in which the number of defective memory cells can be detected during a test of the integrated semiconductor memory.

BACKGROUND

During their production, integrated semiconductor memories, for example DRAM (dynamic random access memory) semiconductor memories, undergo numerous tests at different levels before being sent to a customer. In general, integrated semiconductor memories are tested as early as during their production at the wafer level by contact tips of a tester being positioned at specially provided locations in the circuit layout, to measure important design parameters. If a memory module has successfully passed the functional test at the wafer level in the front end of a production line, the individual memory chips are removed from the wafer and the chips are welded in a housing. The finished housed memory module is subsequently subjected to a renewed functional test at the component or module level. The memory chips are tested individually during the test at the component level, whereas the functioning of the memory chips in a possible application is tested during the module test.

The tests at the component and module levels generally comprise a plurality of test steps that are typically carried out at different temperatures on a limited number of test receptacles. Due to thermomechanical effects and receptacle wear, contact faults can occur between the receptacle and test component. The failure rate is greatly dependent on the type of receptacle and the maintenance thereof, but is typically in the percentage range. To avoid rejecting defect-free devices which have not successfully passed a test due to contact faults, a second test with the same test conditions is generally carried out in the case of integrated semiconductor memories. All semiconductor chips which pass the test in the second test cycle are classified as defect-free modules. It is assumed, in this case, that a contact fault was the cause of the failure in the first test cycle.

However, this procedure is problematic with regard to marginal or sporadically failing memory modules. Sporadically failing modules are unstable failures, and upon multiple repetitions of a test, the specification, is met in an unforeseen manner during one test cycle and is not met during a later renewed test cycle with the same test conditions. Such unstable failures are based, for example, on charging effects of contact holes which have been affected by contamination residues as a result of a previous process, such as an etching process. In the case of marginally failing modules, so-called borderline cases, the measured parameters are at the specification limit. However, since the design parameters are generally measured with a sufficient test bias, the borderline cases constitute less of a problem in comparison to sporadic failure parts. By contrast, sporadically failing devices have to be regarded as a potential quality risk.

During a functional test, contact failures of integrated semiconductor memory chips can be differentiated from marginal or sporadic failures on the basis of the number of failed memory cells of a memory module. It has been shown that contact failures, which are caused for example by a poor contact between a data input terminal, command line or an address line and a contact terminal of the test receptacle, leads to a very high number of failure cells within a memory cell array of the semiconductor memory. In the case of marginally or sporadically failing semiconductor memories, the number of defective memory cells of a memory cell array is limited to significantly fewer individual cells than is the case with contact failures. In the case of a semiconductor memory having a memory capacity of 512 MB, the number of defects on account of marginally or sporadically failing memory cells is approximately 1000 individual cells per memory module, for example. This generally involves weak individual cells or defective bit or word lines.

To ensure improved production testing with regard to yield and quality, therefore, only memory modules in which the number of failed memory cells per test exceeds a specific threshold value should be approved for a repeat test, since the possible cause of error here, on account of the high number of defective memory cells during the first test cycle, is very probably attributable to a contact problem between measurement receptacle and test component. Such a differentiation of genuine and non-genuine contact faults of memory modules using the number of failing memory cells as a differentiation criterion during a test of the integrated semiconductor memory, cannot typically be carried out during production testing, however. This is due to the fact that existing test systems are generally not furnished with additional equipment which would permit the defects to be counted during a functional test. As the memory modules are becoming faster, the testing systems operate too slowly to detect defective individual memory cells or the number of defects that have occurred.

SUMMARY OF THE INVENTION

The present invention relates to an integrated semiconductor memory and corresponding method in which, at the end of a test, in the case of a failure of the integrated semiconductor memory, it is possible to deduce the possible cause of failure.

The invention includes an integrated semiconductor memory including an output terminal, a memory cell array with at least one memory cell for storing a data value, an evaluation circuit with a counter, a programming circuit for generating a programming signal and a programming element including a first and a second programming state. The evaluation circuit is designed to alter a counter reading if the data value stored in the memory cell deviates from a desired value stored in the memory cell. It generates, on the output side, a counter reading signal containing an item of coded information about the counter reading. The evaluation circuit feeds the counter reading signal to the programming circuit on the input side. The programming circuit is designed to generate the programming signal on the output side if the counter reading of the counter exceeds a threshold value. The programming circuit is connected, on the output side to an input terminal of the programming element. The programming element is designed to perform a state change from the first to the second programming state if the programming signal is fed to it on the input side. The programming state of the programming element can be read out via the output terminal.

In one aspect, the integrated semiconductor memory includes a control circuit. The memory cell of the memory cell array can be addressed via an address. The control circuit is designed to generate a first control signal on the output side, which can be used to read out the data value of the memory cell associated with the address.

According to a further feature of the integrated semiconductor memory, the evaluation circuit includes a first input terminal, a first memory component and a second memory component. The first memory component is designed so the data value of the memory cell can be stored in the first memory component. The second memory component is designed such that the desired value of the data value stored in the memory cell is stored in the second memory component. The first memory component is connected to the first input terminal of the evaluation circuit, so that it can be fed the data value of the memory cell of the memory cell array, via the first input terminal of the evaluation circuit.

In one embodiment, the first memory component is designed as a first memory register.

In another embodiment of the integrated semiconductor memory, the second memory component is designed as a second memory register. The evaluation circuit has a second input terminal, which is connected to the second memory register on the input side. The desired value of the data value stored in the memory cell of the memory cell array can be fed to the second input terminal of the evaluation circuit.

In accordance with a further feature of the integrated semiconductor memory according to the invention, the control circuit is designed to calculate the desired value of the data value stored in the memory cell from the address of the memory cell, and feed the desired value to the second memory register on the input side.

In the case of the integrated semiconductor memory according to the invention, the second memory component can be designed as a cell array with memory cells. In the case of this embodiment, the evaluation circuit has a second input terminal, which is connected to the cell array on the input side. The second input terminal of the evaluation circuit can be fed an internal control signal for read-out of one of the memory cells of the cell array of the evaluation circuit.

In a further circuit design of the integrated semiconductor memory, the control circuit is designed to calculate, on the output side, from the address of the memory cell of the memory cell array, an address of one of the memory cells of the cell array of the evaluation circuit in which the desired value of the data value stored in the memory cell of the memory cell array is stored. The control circuit is further designed to generate, on the output side, a second control signal for read-out of one of the memory cells of the cell array of the evaluation circuit in which the desired value of the data value stored in the memory cell of the memory cell array is stored. The internal control signal is then fed to the cell array of the evaluation circuit on the input side.

In one aspect, the evaluation circuit of the integrated semiconductor memory includes a comparator circuit for generating an assessment signal. The first memory component feeds the data value stored in it to the comparator circuit on the input side. The second memory component feeds the desired value of the data value stored in the memory cell to the comparator circuit on the input side. The comparator circuit is designed to generate a first level of the assessment signal on the output side if the data value stored in the memory cell deviates from the desired value. It furthermore generates a second level of the assessment signal on the output side if the data value stored in the memory cell corresponds to the desired value.

In accordance with a further embodiment, the counter of the integrated semiconductor memory according to the invention includes a first input terminal. The comparator circuit feeds the assessment signal to the first input terminal of the counter. The counter is designed to alter the counter reading if the first level of the assessment signal is fed to the counter.

The counter may be designed as a binary counter which generates, on the output side, the counter reading signal comprising a bit sequence, which represents a binary coding of the counter reading of the counter.

According to another circuit concept, the programming circuit of the integrated semiconductor memory comprises a subtraction circuit for generating a difference signal. The counter reading of the counter and the threshold value can be fed to the subtraction circuit on the input side. The subtraction circuit is designed to determine a difference between the counter reading of the counter and the threshold value and generate, on the output side, a difference signal containing an item of coded information about the difference between the counter reading of the counter and the threshold value.

In one embodiment of the integrated semiconductor memory, the subtraction circuit has at least one differential amplifier.

According to a further feature of the integrated semiconductor memory, the programming circuit includes a control logic for generating the programming signal. The difference signal can be fed to the control logic on the input side. The control logic is designed to evaluate the difference signal and generate the programming signal on the output side, if the counter reading of the counter exceeds the threshold value.

In another implementation of the integrated semiconductor memory, the programming element is designed to generate an output signal with a first or second level on the output side. The programming element is designed to generate the output signal with the first level on the output side in the first programming state and generate the output signal with the second level on the output side in the second programming state.

In another embodiment the programming element is designed as a bistable multivibrator.

According to a further feature of the integrated semiconductor memory, the latter has a second control circuit. The second control circuit is designed to generate, on the output side, a threshold value signal including a bit sequence, representing a binary coding of the threshold value.

In another embodiment of the integrated semiconductor memory according to the invention, the second control circuit is designed to generate a first and a second reset signal on the output side. The counter includes a second input terminal for application of the first reset signal. The programming element includes a second input terminal for application of the second reset signal. The counter is designed so that the counter reading can be reset as a result of driving the second input terminal of the counter with the first reset signal. The programming element is designed to assume the first programming state as a result of driving the second input terminal of the programming element with the second reset signal.

In another embodiment, the second control circuit of the integrated semiconductor memory according to the invention may include control terminals for application of control signals. In this embodiment, the second control circuit is designed so the threshold value can be set by the application of the control signals.

In a further embodiment, the integrated semiconductor memory comprises a controllable switch including a first and a second switching state. The assessment signal of the comparator circuit can be fed to the output terminal of the integrated circuit in the first switching state of the controllable switch. The output signal of the programming element can be fed to the output terminal of the integrated circuit in the second switching state of the controllable switch.

The method of testing includes programming a threshold value for a functional test of the integrated semiconductor memory. The counter reading of a counter is subsequently initialized. A data value is then read into a memory cell of the integrated semiconductor memory. The data value that has been read into the memory cell is subsequently read out. The data value read out from the memory cell is subsequently compared with a desired value of the data value of the memory cell. A counter reading is altered if the data value read out from the memory cell deviates from the desired value of the memory cell. The counter reading of the counter is subsequently compared with the threshold value. A programming element is programmed with a first programming state if the counter reading falls below the threshold value and is programmed with a second programming state if the counter reading exceeds the threshold value. A first level of an output signal is generated if the programming element has the first programming state. A second level of the output signal is generated if the programming element has the second programming state.

The method according to the invention for testing an integrated semiconductor memory makes it possible, in particular, during the initialization of the counter reading, to initialize the counter reading by resetting it to a start value.

In one aspect of the method for testing an integrated semiconductor memory, an integrated semiconductor memory is provided including a memory circuit with memory cells for storing a respective desired value. It is possible for each address of a memory cell of the memory cell array to be allocated a desired value from one of the memory cells of the memory circuit. The reading in of a data value into a memory cell is effected by reading in an address of the memory cell into an address register. The data value is then read into the memory cell associated with the address. In order to carry out the comparison of the data value read out from the memory cell with the desired value of the data value of the memory cell, the desired value of the memory cell is determined by reading out the desired value from the memory cell of the memory circuit assigned to the address.

In accordance with a further design of the method for testing an integrated semiconductor memory, the method is repeated according to a variant of the type described above if the output signal has the second level at the end of the test. In this case, the number of failed individual cells during the first test lies above a limit value predefined by the threshold value. Thus, a contact-making problem between the integrated semiconductor memory and the connection contacts of the measurement receptacle can be taken into consideration with high probability as a possible cause of error. In the case of a contact-making problem of a semiconductor memory, the number of failed individual cells in the case of a 512 MB semiconductor memory is typically in the region of 1000 individual cells per semiconductor memory. It is also possible, of course, to program other threshold values with the method according to the invention. In general, different defect patterns, for example, a defective word or bit line, exhibit a defect-typical number of failures. By adapting the threshold value to this characteristic number of defective individual cells, a possible cause of error can be inferred very well. The method can therefore preferably also be used for defect analysis purposes.

The above and still further aspects, features, and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
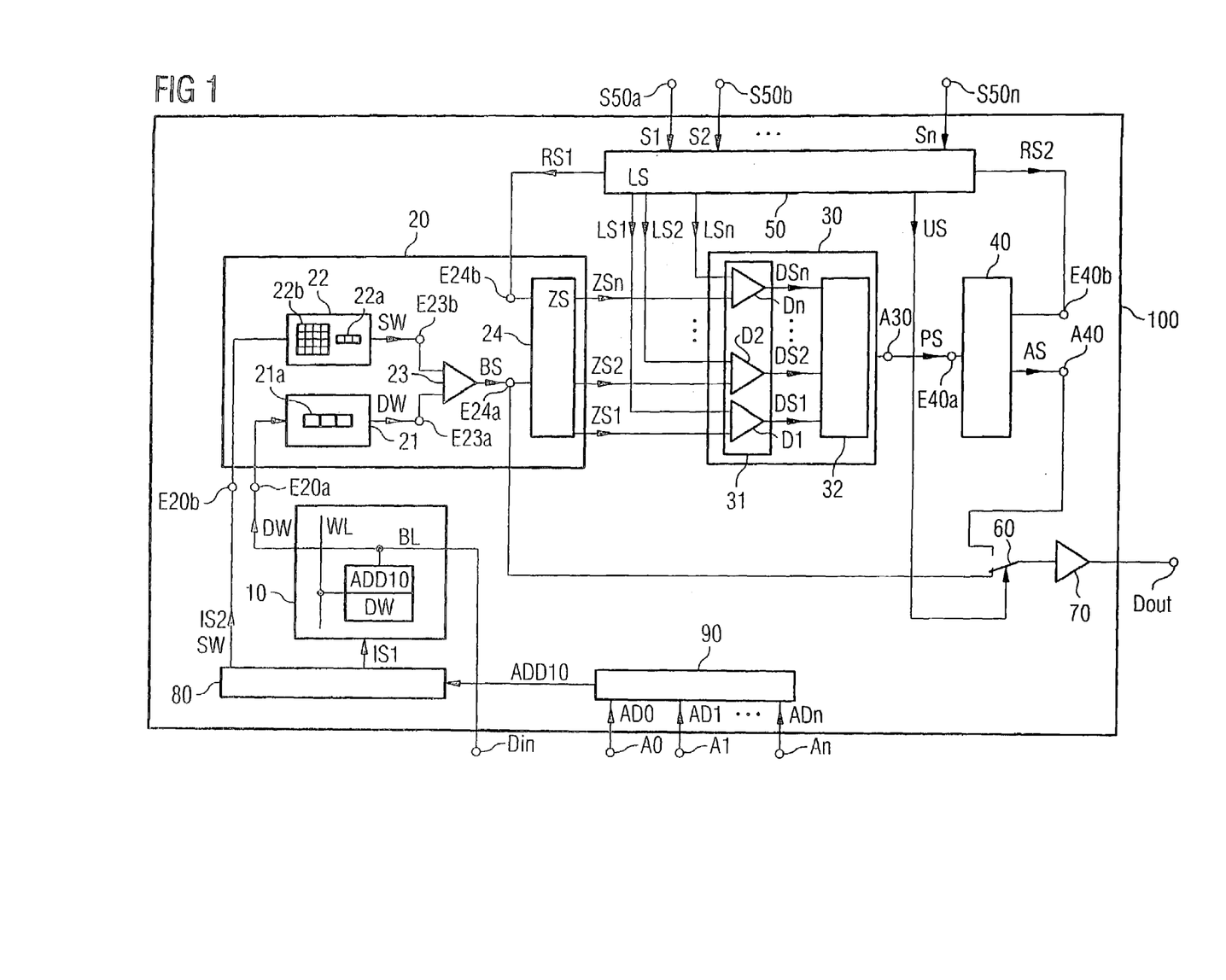
FIG. 1 illustrates an embodiment of an integrated semiconductor memory according to the invention.

FIG. 1 shows an integrated memory 100 having a memory cell array 10, an evaluation circuit 20, a programming circuit 30 and a programming element 40. The integrated semiconductor memory is provided with an input terminal Din for reading in data values DW into a memory cell Z of the memory cell array 10. One memory cell Z is illustrated within the memory cell array 10 for the sake of simplicity. The memory cell can be driven via a word line WL. It is connected to a bit line BL to read a data value DW in or out. Within the memory cell array 10, the memory cell can be addressed by an address ADD10. The memory cell array 10 is connected to a first input terminal E20a of the evaluation circuit 20 on the output side.

The evaluation circuit 20 comprises a first memory component 21, to which the data value DW stored in the memory cell Z is fed on the input side via the input terminal E20a. The evaluation circuit also comprises a second memory component 22 connected to a second input terminal E20b on the input side of the evaluation circuit. The second memory component serves for storing a desired value SW which should have been written to the memory cell Z in a preceding read operation during a test of the integrated semiconductor memory. The first memory component 21 is connected to a first input terminal E23a of a comparator circuit 23 on the output side, and feeds the data value DW buffer-stored in first memory component 21 to the first input terminal E23a. The second memory component 22 is connected to a second input terminal E23b of the comparator circuit 23 on the output side and feeds the desired value SW to the second input terminal E23b. The comparator circuit 23 compares the data value DW fed to it on the input side with the desired value SW fed to it on the input side and generates an assessment signal BS in a manner dependent on this comparison on the output side, and feeds the assessment signal to a first input terminal E24a of a counter 24. The assessment signal BS is forwarded via a controllable switch 60 and an output driver 70 directly to an output terminal Dout of the integrated semiconductor memory. Depending on the level of the assessment signal BS, the counter 24 alters an internal counter reading. This is done, for example, by incrementing or decrementing the instantaneous counter reading. The internal counter reading of the counter 24 is coded by a binary bit sequence ZS1, ZS2, ..., ZSn. Each bit of the binary bit sequence can be converted into a counter reading signal ZS by the counter 24 on the output side. The individual bit signals of the binary bit sequence ZS1, ZS2, ..., ZSn are fed to the programming circuit 30 on the input side.

The programming circuit 30 includes a subtraction circuit 31 and a control logic 32. In addition to the instantaneous counter reading of the counter 24, a further binary bit sequence LS1, LS2, ..., LSn, by which a threshold value is coded, is fed to the programming circuit 30, on the input side by a threshold value signal LS. The subtraction circuit 31 forms a difference between the counter reading of the counter 24, which counter reading is fed to it on the input side by means of the bit sequence ZS1, ZS2, ..., ZSn, and the threshold value fed to it by means of the bit sequence LS1, LS2, ..., LSn and generates the difference signals DS1, DS2, ..., DSn on the output side. Each individual difference signal in this case represents a binary digit of a binary coded difference between the counter reading of the counter 24 and the threshold value. Differential amplifiers D1, D2, ..., Dn may be used for performing the difference formation and for subsequently generating the difference signals DS1, DS2, ..., DSn, the binary coded bit sequence ZS1, ZS2, ..., ZSn of the counter reading and the binary coded bit sequence LS1, LS2, ..., LSn of the threshold value being fed to said differential amplifiers on the input side.

On the basis of the levels of the difference signals present at the control logic 32, the control logic 32 decides whether the instantaneous counter reading of the counter 24 lies above or below the threshold value predefined by a second control circuit 50. If the instantaneous counter reading of the counter 24 lies below the threshold value, the control logic 32 generates the programming signal PS with a first signal level, for example a low signal level, on the output side. By contrast, if the instantaneous counter reading of the counter 24 lies above the threshold value predefined by the second control circuit 50, then the control logic 32 generates the programming signal PS with a high signal level on the output side.

The programming signal PS is fed to the programming element 40 on the input side, via the connection of the output terminal A30 of the programming circuit 30, to a first input terminal E40a of the programming element 40. The programming element 40 assumes a first or a second programming state depending on whether the programming signal PS has the low or the high signal level. The programming element 40 may therefore be designed as a multivibrator, for example. In the first programming state, the programming element 40 generates an output signal AS with a low signal level at an output terminal A40, whereas in the second programming state, programming element 40 generates a high signal level of the output signal AS at output terminal A40. The output terminal A40 of the programming element 40 is connected to the output terminal Dout of the integrated semiconductor memory via the controllable switch 60 and the output driver 70.

In order to control the controllable switch 60, the second control circuit 50 generates a switching signal US, by means of which the controllable switch can be switched into a first switching state or a second switching state. In the first switching state, the output side of the comparator circuit 23 of the evaluation circuit 20 is connected to the output terminal Dout of the integrated semiconductor memory via the output driver 70. In the second switching state, by contrast, the programming element 40 is connected, on the output side, to the output terminal Dout of the integrated semiconductor memory via the output driver 70. Consequently, in the first switching state of the controllable switch 60, the assessment signal BS is present at the output terminal Dout of the integrated semiconductor memory, and the assessment signal contains an item of information regarding whether the data value DW stored in the memory cell Z corresponds to the desired value SW of the data value. In the second switching state of the controllable switch 60, the output signal AS of the programming element 40 is present at the output terminal Dout of the integrated semiconductor memory 100. In this case, information regarding whether the number of defective memory cells lies above or below the predefined threshold value occurs at the output terminal Dout.

Employing the integrated circuit specified during a functional test of the integrated semiconductor memory, the counting of the failure cells of the integrated semiconductor memory is moved into the memory module that is respectively to be tested. During the functional test of the semiconductor memory, in the first switching state of the controllable switch 60, information regarding whether the memory cell Z currently being read is defective can be tapped off at the output terminal Dout by a connected test system. At the end of the functional test, the second control circuit 50 controls the controllable switch 60 into the second switching state by switching signal. US. The test system can then identify whether the number of defect cells that occurred lies above the predefined threshold value, so that a contact fault between the corresponding semiconductor memory and the contact connections of the test receptacle can be inferred in this case. It is recommended to repeat the test cycle in this case. However, if the low signal level of the output signal occurs at the output terminal Dout of the integrated semiconductor memory in the second switching state of the controllable switch 60 at the end of the functional test, then the number of defective memory cells that occurred lies below the predefined threshold value. A genuine failure device, for example a marginally or sporadically failing device, is probably involved in this case. Thus, the affected memory module is no longer subjected to a repeat test and can be sorted out as a defective device.

Since a functional test of the memory includes a plurality of different tests, it is advantageous to reset the counter 24 to a start value, for example the start value of 0, before each new test run. For this purpose, the counter 24 has a second input terminal E24b, to which a first reset signal RS1 is fed by the second control circuit 50.

Once the functional test is concluded, (including a plurality of individual tests) the programming state of the programming element 40 is reset to the first programming state before the start of a further functional test. For this purpose, the programming element 40 is provided with a second input terminal E40b, to which a second reset signal RS2 can be fed by the control circuit 50.

Figure 2:
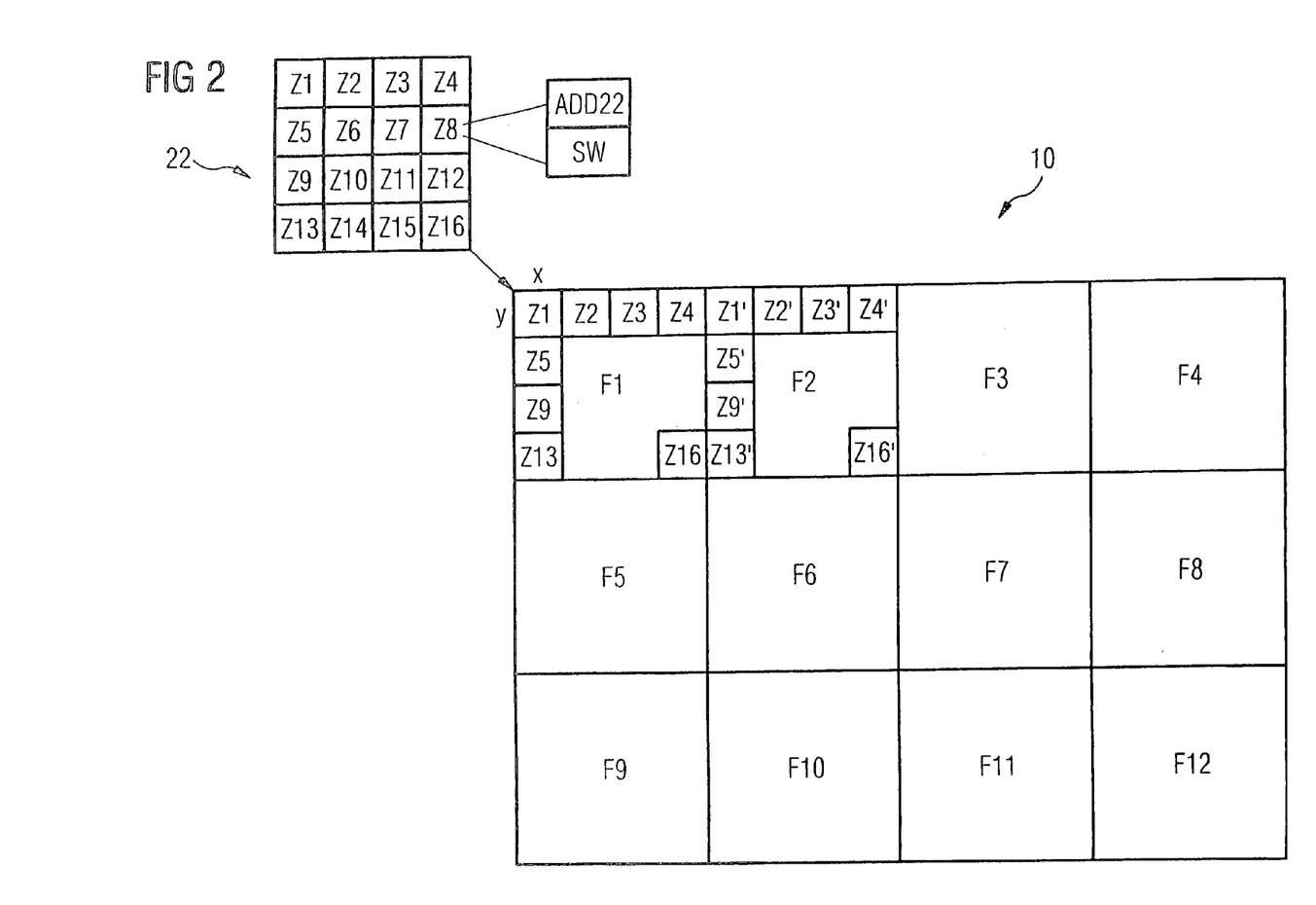
FIG. 2 illustrates an embodiment of a second memory component of the evaluation circuit of the integrated semiconductor memory according to the invention.

The configuration of the second memory component 22 of the evaluation circuit 20 is explained in more detail below with reference to FIG. 2. The integrated semiconductor memory 100 is provided with a further control circuit 80 and an address register 90. The address signals AD0, AD1, ..., ADn are applied to the address register 90 via address terminals A0, A1, ..., An. The address ADD10, which is applied to the address terminals and addresses the memory cell Z in the memory cell array 10, is fed to the control circuit 80 on the input side. In order to compare the data value DW stored in the memory cell Z with the desired value SW of the data value, the control circuit 80 drives the memory cell array 10 with an internal control signal IS1. As a result, the memory cell Z associated with the applied address ADD10 is read and the data value DW is fed to the first memory component 21, which is designed as a register, for example. The data value DW of the memory cell Z is buffer-stored in the first memory register 21.

The control circuit 80 is designed in to algorithmically calculate the desired value which is stored in the memory cell Z by the address ADD10 fed to the control circuit on the input side from the address register 90. For this purpose, the memory cell array 10 is subdivided into individual memory arrays each comprising an identical number of individual memory cells. For the sake of simplicity, FIG. 2 illustrates twelve memory arrays F1, ..., F12 each comprising sixteen individual memory cells. The memory cells of a memory array are in each case assigned a desired value SW of the data value stored in them. The desired value of a memory cell within a memory array can be determined by means of the address ADD10 associated with it. In this case, the memory arrays F1, F2, ..., F12 of the memory cell array 10 are designed in such a way that the desired values SW of the memory cells Z1, ..., Z16 of the memory array F1 are in each case repeated in the identically arranged memory cells Z1', Z2', ..., Z16' of the rest of the memory arrays F2 to F12. Therefore, the second memory component 22 need only comprise a cell array having the size of one of the memory arrays F1, F2, ..., F16. In the example of FIG. 2, the second memory component 22 is constructed for example as a 4×4 memory matrix comprising the memory cells Z1, Z2, ..., Z16. From the memory cells of the cell array 22, the control circuit 80 selects from the 4×4 memory matrix precisely that memory cell in which is stored the desired value of the memory cell Z of the memory cell array 10 that is to be read. By virtue of the algorithmic calculation of the desired values of the memory cells of the memory cell array 10 by means of the addresses ADD10, the second memory component can thus be constructed as a comparatively simple memory matrix comprising sixteen individual memory cells, by way of example. By means of a second internal control signal IS2, the desired value SW of a memory cell Z1, ..., Z16 of the cell array 22 that can be addressed by means of an address ADD22 can be selected and be fed to the comparator circuit 23.

The threshold value which, when exceeded, makes it possible to infer a contact-making problem of the memory device in the measurement receptacle can be set by means of control signals S1, S2, ..., Sn that are applied to control terminals S50a, S50b, ..., S50n of the control circuit 50. This enables the cause of failure of a semiconductor memory to be circumscribed more closely. This circumscribing of the cause of error is made possible by the fact that there is a correlation between individual defect types and the number of affected memory cells. If it is assumed that, by way of example, 256 memory cells are connected to an individual bit line of the memory cell array, then the threshold value is advantageously set to 256. If precisely 256 defective memory cells are detected during a test cycle, then a defective bit line can be inferred.

Furthermore, the integrated semiconductor memory according to the invention permits design limits to be thoroughly tested. A parameter to be tested, for example a read-out time during which a memory cell must be connected to a bit line in order to detect a data value stored in the memory cell as a result of a potential change on the bit line, is predefined for this purpose with a specific value by a test system. The more critically this value of the parameter to be tested, for example the read-out time, is set, the more memory cells will fail during such a functional test.

Figure 3:
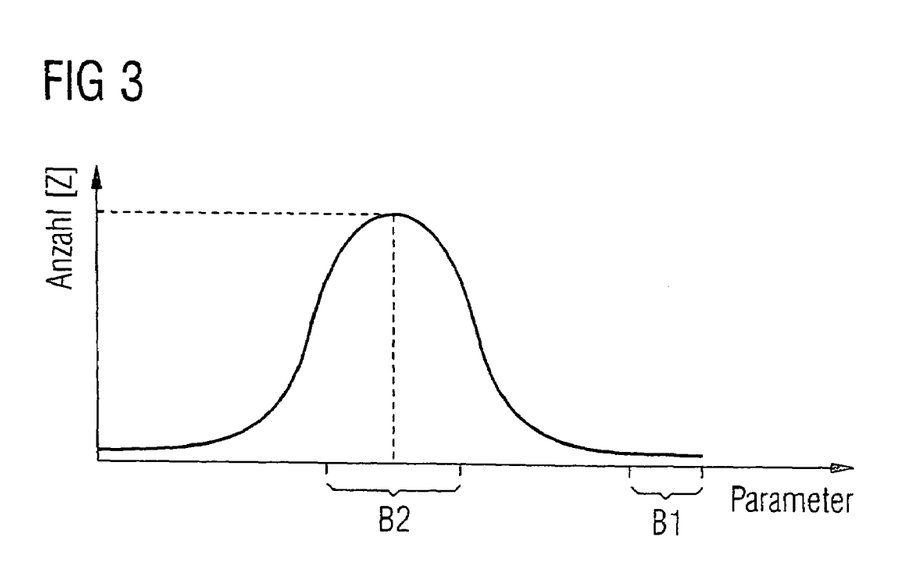
FIG. 3 depicts a defect distribution of failed individual cells of an integrated semiconductor memory during a functional test of the integrated semiconductor memory.

In this respect, FIG. 3 shows the distribution of the number of defective memory cells over a critical range of a parameter. The area beneath the curve corresponds to the memory cells of a memory cell array that failed overall given differently set critical values of the parameter to be tested. Only a small number of memory cells within the memory cell array fail within a range B1, whereas most of the memory cells fail in the range B2 of the parameter to be tested. Therefore, the parameter to be tested will have reached a design limit in the range B2. By contrast, the failures in the range B1 can be attributed to a few poor individual cells. If the threshold value is set to the number of memory cells that fail in the range B2, then the set value of the parameter to be tested lies at the design limit if the number of defective memory cells exceeds this threshold value during a test run.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An integrated semiconductor memory, comprising:
    a memory cell array including at least one memory cell configured to store a data value;
    an evaluation circuit including a counter, the evaluation circuit altering a counter reading of the counter in response to the data value stored in the memory cell deviating from a desired value, and generating a counter reading signal including an item of coded information about the counter reading of the counter;
    a programming circuit configured to generate a programming signal, wherein the evaluation circuit supplies the counter reading signal to the programming circuit and the programming circuit generates the programming signal in response to the counter reading of the counter exceeding a threshold value;
    a programming element configurable in a first and a second programming state, wherein the programming element changes from the first programming state to the second programming state in response to the programming signal being supplied to the programming element; and
    an output terminal configured to read out the programming state of the programming element.

2. The integrated semiconductor memory of claim 1, wherein the memory cell of the memory cell array is addressable by an address, the integrated semiconductor memory further comprising:
    a control circuit configured to generate a first control signal, the data value of the memory cell associated with the address being read out in response to the first control signal.

3. The integrated semiconductor memory of claim 2, wherein:
    the evaluation circuit comprises a first input terminal, a first memory component, and a second memory component;

the first memory component is configured to store the data value of the memory cell;

the second memory component is configured to store the desired value of the data value stored in the memory cell; and the first memory component is configured to receive the data value of the memory cell from the evaluation circuit.

4. The integrated semiconductor memory of claim 3, wherein the first memory component comprises a first memory register.

5. The integrated semiconductor memory of claim 3, wherein:

the second memory component comprises a second memory register; and the evaluation circuit is coupled to the second memory register and receives the data value stored in the memory cell of the memory cell array.

6. The integrated semiconductor memory of claim 5, wherein the control circuit calculates the desired value of the data value stored in the memory cell from the address of the memory cell and supplies the desired value to the second memory register.

7. The integrated semiconductor memory of claim 6, wherein:

the second memory component comprises a cell array with memory cells; and the evaluation circuit receives an internal control signal for read-out of one of the memory cells of the cell array.

8. The integrated semiconductor memory of claim 7, wherein:

the control circuit calculates from the address of the memory cell of the memory cell array, an address of one of the memory cells of the cell array of the evaluation circuit in which the desired value of the data value stored in the memory cell of the memory cell array is stored; and the control circuit generates a second control signal for read-out of one of the memory cells of the cell array of the evaluation circuit in which the desired value of the data value stored in the memory cell of the memory cell array is stored, and feeds the internal control signal to the cell array of the evaluation circuit on the input side.

9. The integrated semiconductor memory of claim 3, wherein:

the evaluation circuit comprises a comparator circuit for generating an assessment signal;

the first memory component supplies the data value stored therein to the comparator circuit, and the second memory component supplies the desired value of the data value stored in the memory cell to the comparator circuit; and the comparator circuit generates a first level of the assessment signal in response to the data value stored in the memory cell deviating from the desired value, and generates a second level of the assessment signal in response to the data value stored in the memory cell corresponding to the desired value.

10. The integrated semiconductor memory of claim 9, wherein:

the counter comprises a first input terminal;

the comparator circuit supplies the assessment signal to the counter; and the counter alters the counter reading in response to the first level of the assessment signal being fed to the counter.

11. The integrated semiconductor memory of claim 9, further comprising:

a controllable switch having a first and a second switching state, wherein:

the assessment signal of the comparator circuit is supplied to the integrated circuit in the first switching state of the controllable switch; and the output signal of the programming element is supplied to the integrated circuit in the second switching state of the controllable switch.

12. The integrated semiconductor memory of claim 1, wherein the counter comprises a binary counter which generates the counter reading signal comprising a bit sequence, which represents a binary coding of the counter reading of the counter.

13. The integrated semiconductor memory of claim 1, wherein:

the programming circuit comprises a subtraction circuit for generating a difference signal;

the counter reading of the counter and the threshold value are supplied to the subtraction circuit; and the subtraction circuit determines a difference between the counter reading of the counter and the threshold value and generates a difference signal containing an item of coded information about the difference between the counter reading of the counter and the threshold value.

14. The integrated semiconductor memory of claim 13, wherein the subtraction circuit includes at least one differential amplifier.

15. The integrated semiconductor memory of claim 14, wherein:

the programming circuit comprises a control logic for generating the programming signal;

the difference signal is supplied to the control logic; and the control logic evaluates the difference signal and generates the programming signal in response to the counter reading of the counter exceeding the threshold value.

16. The integrated semiconductor memory of claim 1, wherein the programming element generates an output signal with a first or second level; and the programming element generates the output signal with the first level in the first programming state and the output signal with the second level in the second programming state.

17. The integrated semiconductor memory of claim 16, wherein the programming element comprises a bistable multivibrator.

18. The integrated semiconductor memory of claim 1, further comprising a second control circuit that generates a threshold value signal comprising a bit sequence which represents a binary coding of the threshold value.

19. The integrated semiconductor memory of claim 18, wherein:

the second control circuit generates a first and a second reset signal;

the counter resets the counter reading in response to receipt of the first reset signal; and the programming element assumes the first programming state in response to receipt of the second reset signal.

20. The integrated semiconductor memory of claim 18, wherein the second control circuit sets the threshold value in response to receipt of the control signals.

21. A method for testing an integrated semiconductor memory, comprising:
- (a) programming a threshold value for a first test;
- (b) initializing a counter reading of a counter;
- (c) reading in a data value into a memory cell;
- (d) reading out the data value that was read into the memory cell;
- (e) comparing the data value read out from the memory cell with a desired value of the data value of the memory cell;
- (f) altering a counter reading of the counter in response to the data value read out from the memory cell deviating from the desired value of the memory cell;
- (g) comparing the counter reading of the counter with the threshold value;
- (h) programming a programming element with a first programming state in response to the counter reading of the counter falling below the threshold value;
- (i) programming the programming element with a second programming state in response to the counter reading of the counter exceeding the threshold value;
- (j) generating a first level of an output signal in response to the programming element having the first programming state; and
- (k) generating a second level of the output signal in response to the programming element having the second programming state.

22. The method for testing an integrated semiconductor memory of claim 21, further comprising:
- (l) providing an integrated semiconductor memory having a memory circuit including memory cells for storing a respective desired value, wherein each address of a memory cell of the memory cell array is capable of being allocated a desired value from one of the memory cells of the memory circuit;
- (m) reading in a data value into a memory cell while: reading in an address of the memory cell into an address register; and subsequently reading in the data value into the memory cell associated with the address; and
- (n) comparing the data value read out from the memory cell with the desired value of the data value of the memory cell, the desired value of the memory cell being determined by reading out the desired value from the memory cell of the memory circuit which is assigned to the address.

23. The method for testing an integrated semiconductor memory of claim 21, further comprising:
- (l) reading out the level of the output signal; and repeating (a)–(k) in response to the output signal having the second level.

* * * * *